US006990382B2

(12) United States Patent
Cheng

(10) Patent No.: US 6,990,382 B2
(45) Date of Patent: Jan. 24, 2006

(54) CONTROL SYSTEM FOR DIGITAL SOUND EFFECT AND THE METHOD OF THE SAME

(75) Inventor: Eric Cheng, Taipei (TW)

(73) Assignee: C-Media Electronics, Inc., Taipei (TW)

( * ) Notice: Subject to any disclaimer, the term of this patent is extended or adjusted under 35 U.S.C. 154(b) by 879 days.

(21) Appl. No.: 09/962,979

(22) Filed: Sep. 24, 2001

(65) Prior Publication Data

US 2003/0059057 A1 Mar. 27, 2003

(51) Int. Cl.
*G06F 17/00* (2006.01)
*H04B 3/00* (2006.01)
*H04B 7/212* (2006.01)
*H03G 3/00* (2006.01)

(52) U.S. Cl. ........................... 700/94; 381/61; 381/77; 381/82; 370/442

(58) Field of Classification Search ................. 381/61, 381/77, 80, 82; 370/442, 503, 509, 479; 700/94

See application file for complete search history.

(56) References Cited

U.S. PATENT DOCUMENTS 5,406,634 A * 4/1995 Anderson et al. ............. 381/82
5,487,067 A * 1/1996 Matsushige ................. 370/460
5,798,818 A * 8/1998 Derderian et al. ............ 352/31

OTHER PUBLICATIONS

Pohlmann, Ken. Principles of Digital Audio. 1995, McGraw Hill, 3rd Edition, pp. 129-131.*

* cited by examiner

*Primary Examiner*—Vivian Chin
*Assistant Examiner*—Devona E Faulk
(74) *Attorney, Agent, or Firm*—Perkins Coie LLP

(57) ABSTRACT

A control method for controlling the sound effect system, comprises implanting a control code into a sound effect data that is transmitted to a sub woofer speaker. Then, the sound effect data with the control code is transmitted to the sound effect system. Next step is to control speakers of the sound effect system by means of the control code. Wherein a data transmission frame between the sound effect system and a computer system for controlling the sound effect system comprises a plurality of bit cells, wherein the data transmission frame includes: a sound effect data transmitted by a data bit; and a control code transmitted by a control bit.

14 Claims, 7 Drawing Sheets

CONTROL SYSTEM FOR DIGITAL SOUND EFFECT AND THE METHOD OF THE SAME

FIELD OF THE INVENTION

The present invention relates to a control system for digital sound effect, and more specifically, to a method and control system for home theater, the system allows the digital control code to be transmitted while transmitting the sound effect data to control the sound effect.

BACKGROUND OF THE INVENTION

Along with the rapid development of electronic industry, it is not uncommon to play films with advance sound and visual effects on computers anymore. Therefore, the requirement for video and audio performance has become more and more stringent. Except for the need of higher resolution and visual quality, in the field of audio frequency and sound effect, stereo sound effect has gradually replaced mono sound effect. However, the traditional stereo sound effect generates sound through lateral panning of sounds between two speakers to simulate the real three-dimensional sound source movements, and does not actually generate sounds in a three-dimensional space. Another type of surrounding sound generates three-dimensional sounds through multiple speakers, yet it is impossible to precisely locate sounds in a space. Therefore, the sound effect is unsatisfactory.

In recent years, head-related transfer function (HRTF) has been widely used in the field of three-dimensional sound locating technique. Because HRTF simulates the sound effect model heard by a human ear in a three-dimensional space and the parameters corresponding to the three-dimensional sound effect at every spot of the space are determined by its distance, azimuth, and elevation, the listener feel like within the real atmosphere of the sound while playing a film. However, the method of utilizing two sets of speakers to simulate three-dimensional sound effect still exhibits some shortcomings and limitations. For example, those speakers need better frequency response, the positions of the speakers need to be leveled with human ear, the locations of the listener and the speakers should be arranged so as to become an equilateral triangle, the rear surrounding effect should be realistic enough, and the sweet spot which is the area actually generating surrounding sound effect needs to be large enough, otherwise not all people within the space are able to enjoy the sound effect. Therefore, the structure of utilizing four or more speakers is then introduced.

Please refer to FIG. 1A of the prior art, the 5.1D sound system 10A, widely used among family theaters, includes four satellite speakers, each at the front left, front right, rear left, and rear right directions of the listener 144 120, i.e., front left (FL) speaker 110, front right (FR) 112, rear left (RL) 114, rear right (RR) 116, respectively, and with an additional sub woofer 118 to become a five-speaker system. Finally, the popular 5.1D sound system 10A also includes a voice speaker 106 near the screen 104 to play front scene voices, such as the dialogues between actors.

Generally speaking, the family theater system stated above can be controlled by a computer system 102, such as a personal computer (PC), through a sound control unit 1022 (e.g., a sound card) connected with three pairs of transmission lines 122, 124, and 126 to transmit the sound effect data needed by the six stated speakers to a control circuit 108A. Later on, the sound effect data is transferred to FL speaker 110, FR speaker 112, RL speaker 114, RR speaker 116, voice speaker 106, and sub woofer 118 separately through transmission lines 128, 130,132,134, 136, and 138 to generate sound. When the listener 120 watches film, listens to music, or plays computer game, the required three-dimensional sound effect can be realistically generated by the stated sound system 10A. Among the stated speakers, except the sub woofer 118 is used to generate low frequency sound, all the other speakers, including FL speaker 110, FR speaker 112, RL speaker 114, and RR speaker 116, are used to play mid and high frequency sound.

Besides, the conventional sound system 10A can only single-directionally receive and process the sound effect data from the computer system 102, but it can't transmit its status data back to the computer system 102, which is inconvenience while using. For example, human ear can't distinguish the directionality of low frequency sound and is insensitive to low frequency (e.g., 170 Hz) sound. In other words, the wattage of the sub woofer 118 has to increase a great deal for the human ear to sense the difference. On the contrary, human ear is quite sensitive to mid and high (e.g., 1–20 KHz) frequency sounds, therefore the wattage of general sub woofer 118 is much greater than other types of speakers, like the two stated speakers constructed in 40 and 5 watts. On the other hand, most conventional speakers need to be continuously kept at stand-by state and wait for the transmission of sound effect data in order to generate sounds. Therefore, about half (i.e., 50%) of the electrical power provided to the speakers is used to maintain the stand-by state and becomes dissipation heat in order to keep the speakers from burning up caused by overheating. Furthermore, while utilizing the stated speakers, if the listener 120 wants to adjust sound volume or sound quality or even switch the speakers on or off, the computer system 102 is lacking the related assisting user interface or accessories, so as that the listener 120 has to be in front of a speaker and lowers his or her body (or even lie on the floor) to adjust the speaker through control buttons. Some high-end sound and audio systems are equipped with additional extension wires to simplify the adjusting procedure. However, when the listener 120 needs to adjust the sound effect of entire sound field, all speakers need to be undergoing constant adjustment, which is a very inconvenient process. There is a great need for easier sound control system and method in order to overcome the difficulties faced by the prior art.

SUMMARY OF THE INVENTION

The object of the present invention is to disclose a control method for sound effect system.

The further object of the present invention is to implant a control code into sound effect data to control the speaker parameters.

The yet object according to the present invention is to provide a communication between the computer system and a sound effect system.

A control method for controlling the sound effect system, comprises implanting a control code into a sound effect data that is transmitted to a sub woofer speaker. Then, the sound effect data with the control code is transmitted to the sound effect system. Next step is to control speakers of the sound effect system by means of the control code. Wherein a data transmission frame between the sound effect system and a computer system for controlling the sound effect system comprises a plurality of bit cells, wherein the data transmission frame includes: a sound effect data transmitted by a data bit; and a control code transmitted by a control bit.

Each the data bit and the control bit is further divided by two sub-units comprises:

a first sub-unit of the data bit used to store a sound effect data transmitted from the computer system to the sound effect system;

a second sub-unit of the data bit used to store a status data transmitted back to the computer from the sound effect system;

a third sub-unit of the control bit used to store a control code transmitted from the computer system to the sound effect system, wherein the control code includes reset pattern; and a fourth sub-unit of the control bit used to store a confirming code transmitted back to the computer from the sound effect system, wherein the confirming code is used to make sure that the computer system and the sound effect system are in the status of synchronization.

A sampling timing for the controlling method comprises: a first timing cycle utilized to indicate the beginning of data string, each the first timing cycle maintaining at "logic one level". The computer system indicates the signal by "logic 1" or "logic 0" using a voltage level to transmit data to the sound effect system during the second timing cycle. During the third and the fourth timing cycle, the voltage levels are floating, thus a voltage output by the computer system is slightly higher than the level of "logic 0". The sampling timing is generated by the phase lock loop (PLL). The third timing cycle is detected by a phase detector (PHD), a mask signal ("logic zero") is generated to input to an AND GATE via a transmission line, thereby maintaining the voltages level of the transmission line at low level during the third timing cycle to prevent the PLL from being interrupted.

The method further include: fetching the transmitted data by using a data decoder and a timing recorder; composing the fetched transmitted data to from the sound effect data and the control code; and transmitting the sound effect data and the control code to means for playing the sound effect and to means defined by the control code.

The method further comprises following steps to obtain the synchronization frame status between the computer system and the sound effect system:

transmitting a reset pattern from the computer system to the sound effect system by suing a transmission line of the sub woofer speaker;

fetching the reset pattern from the transmission line of a sub woofer speaker by the sound effect system;

recognizing the fetched reset pattern by the sound effect system, if the reset pattern is recognized, then transmitting a synchronization confirming code to the computer system;

fetching the confirming code from the sound effect system by the computer system; and recognizing the confirming code, if the confirming code is correct, then transmitting control code to the sound effect system.

A control system for controlling a sound effect system by using a digital control signal, comprising a computer system for generating a control code and a sound effect data to control the sound effect system. A control circuits is implanted in the sound effect system to control a playing parameter of the sound effect system according to the control code and the sound effect data. Wherein the control circuits generates a sampling timing in accordance with the control code, thereby creating frame synchronization between the computer system and the sound effect system, wherein the control code is implanted into the sound effect data that is transmitted to a sub woofer speaker.

Wherein each the data bit and the control bit is divided by two sub-units comprises:

a first sub-unit of the data bit used to store the sound effect data transmitted from the computer system to the sound effect system;

a second sub-unit of the data bit used to store a status data transmitted back to the computer from the sound effect system;

a third sub-unit of the control bit used to store a control code transmitted from the computer system to the sound effect system, wherein the control code includes reset pattern; and a fourth sub-unit of the control bit used to store a confirming code transmitted back to the computer from the sound effect system, wherein the confirming code is used to make sure that the computer system and the sound effect system are in the status of synchronization.

The computer system includes sound effect control unit, the sound effect control unit comprising a PLL (phase lock loop) including a phase detector (PHD) used to generate the sampling timing. A timing recorder is responsive to the phase detector (PHD) to generate a timing signal. A data encoder is responsive to the timing signal to encode a status information of the sound effect system in order to transmit to the computer system via the sub woofer speaker. A data decoder is responsive to the timing signal to decode the control code transmitted via the sub woofer speaker.

A sampling timing is generated by the phase lock loop for controlling, wherein the sampling timing comprises a first timing cycle utilized to indicate the beginning of data string, each the first timing cycle maintaining at "logic one level". A computer system indicates the signal by "logic 1" or "logic 0" using a voltage level to transmit data to the sound effect system during the second timing cycle. During the third and the fourth timing cycle, the voltage levels are floating, thus a voltage output by the computer system is slightly higher than the level of "logic 0". The third timing cycle is detected by the phase detector (PHD), a mask signal ("logic zero") is generated to input to an AND GATE via a transmission line, thereby maintaining the voltages level of a transmission line at low level during the third timing cycle to prevent the PLL from being interrupted.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 4A–4G are the waveforms of the data transmission according to the present invention.

THE DETAILED DESCRIPTION OF THE PREFERRED EMBODIMENT

Figure 1A:
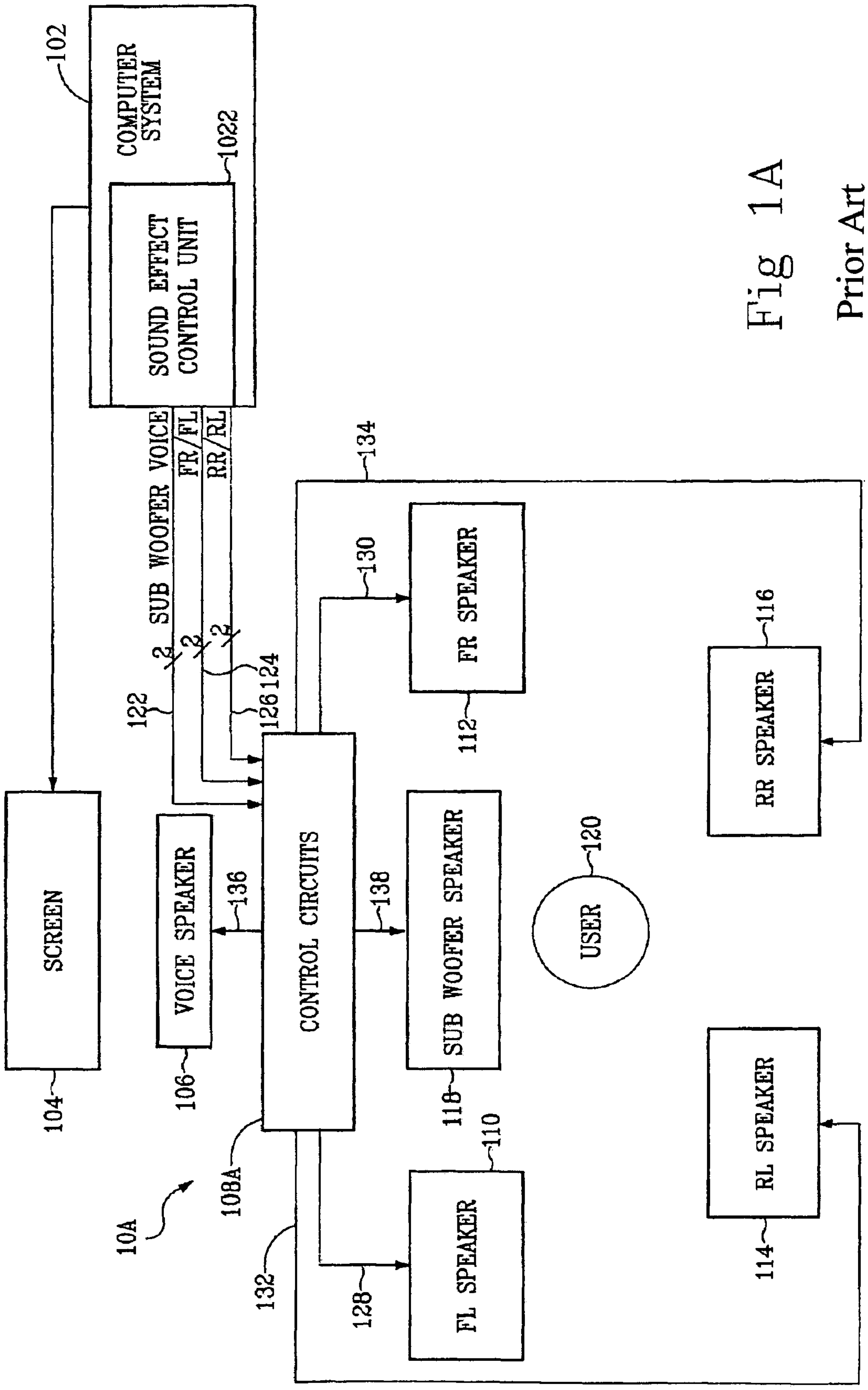
Fig 1A Prior Art
FIG. 1A is architecture of a conventional 5.1 D home theater sound effect system.
Figure 1B:
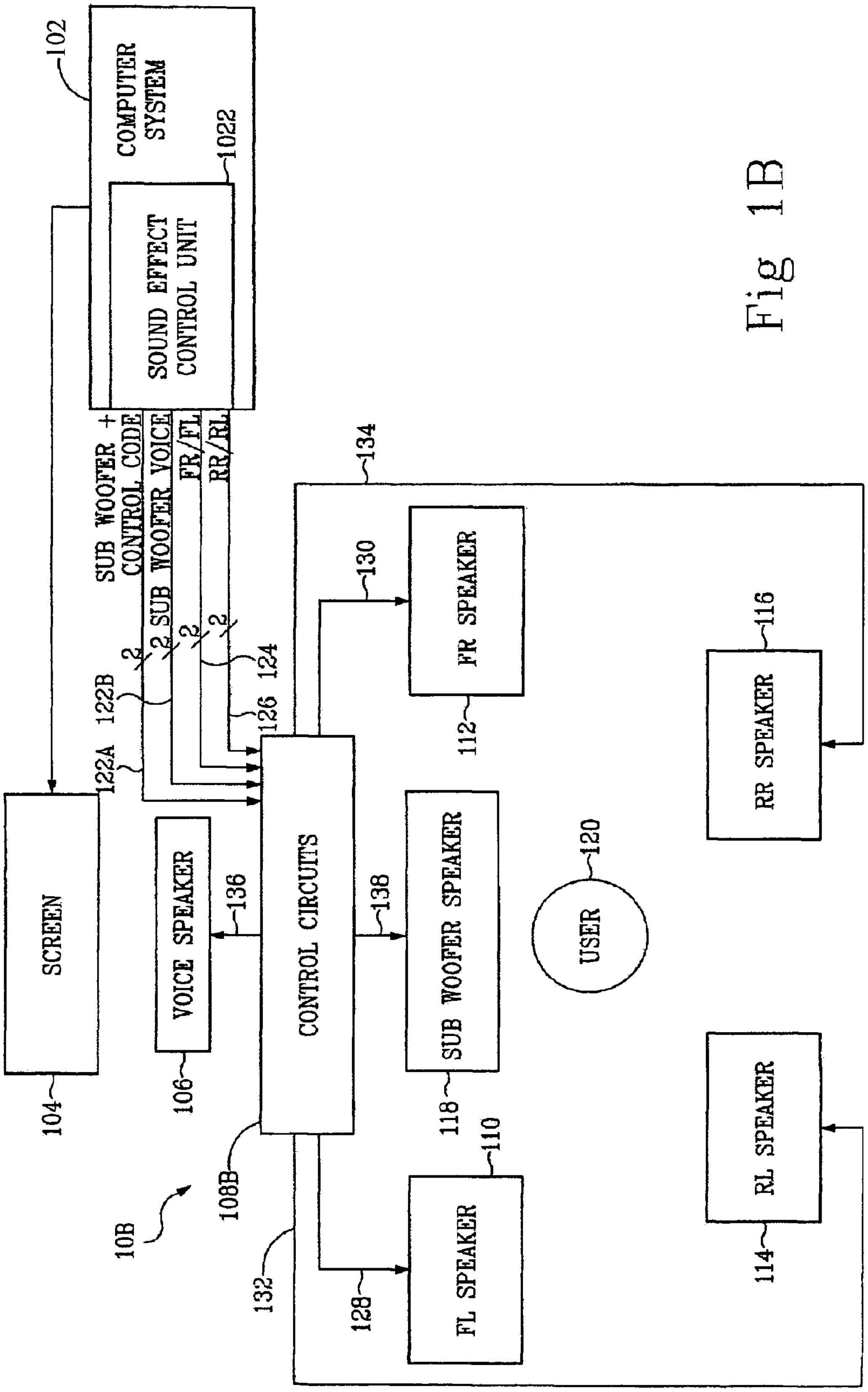
FIG. 1B is architecture of the present invention 5.1 D home theater sound effect system.

Turning to FIG. 1B, it illustrates the home theater 5.1D sound effect system according to the present invention. The transmission line 122A of the sub woofer speaker 118 coupled between the control circuits 108B of the sound effect system 10B and the computer system or the computer system 102 for dual way transmission. The transmission line 122B transmits the sound data from the computer system 102 to the speaker. The sub woofer speaker 118 performs the sound signal with 170 Hz, there is vacant band width can be used during the sound signal is under transmission. The typical used output source is the sampling with 16 bits resolution and 44.1 KHz. The band width under such base is: 44.1 KHz×16 bits=705 kbits. If the 256 times band width is used for the oversampling output, and the sound effect information and digital control code uses one bit for transmitting the data, thus the data transmission band width of the sub woofer speaker 118 is: 705 kbits÷256÷2=1.38 kHz. Obviously, the 1.38 kHz is wider than the required bandwidth of the transmitting frequency (170 Hz) of the sub woofer speaker 118. The present invention uses the transmission line 122A to transmit the control code to the sound effect system 10B. Further, even the higher sampling is used, such as 512 times band width for the oversampling, the present invention may be utilized for transmitting the digital control signal only make sure that the sub woofer speaker 118 will not be distortion. The present invention discloses a system and method for transmitting control code while transmitting the sound effect data.

Figure 2A:
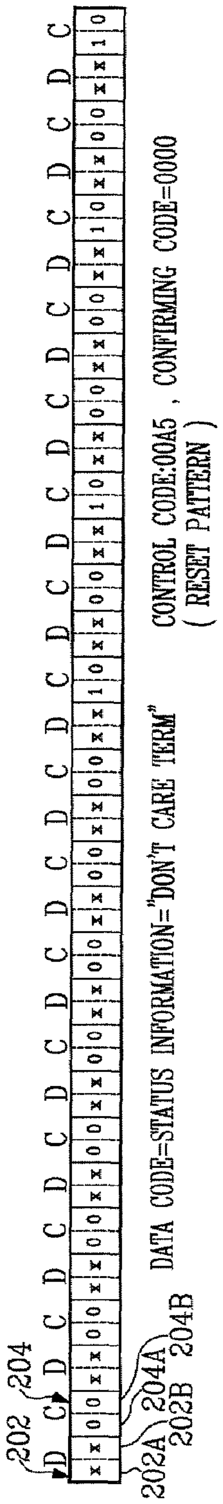
FIGS. 2A–2C are data transmission frames according to the present invention.
Figure 2B:
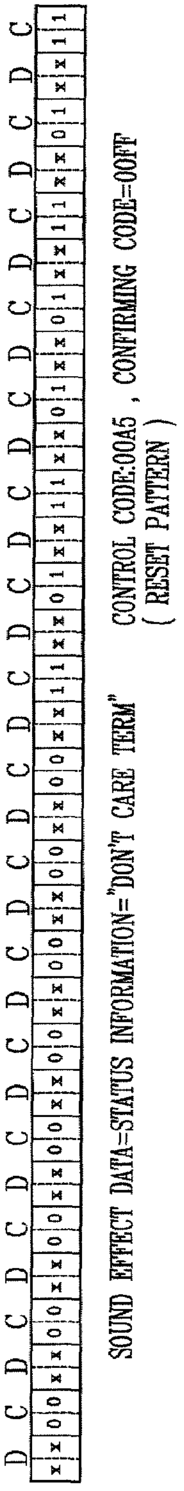

FIG. 2A shows the data transmission frame according to the present invention. The data transmission frame refers to reset pattern for synchronizing the computer system 102 and the sound effect system 10B. 32 bits construct the data transmission frame. The data transmission frame is divided by sound effect data transmitted by data bit 202 and the digital control code transmitted by control bit 204. The data bit 202 and the control bit 204 are respectively indicated by "D" and "C" located on the corresponding bits. Each data bit 202 and the control bit 204 is further divided by two sub-units. The first sub-unit 202A of the data bit 202 is used to store the sound effect data that is transmitted from the computer system 102 to the sound effect system 10B. While the second sub-unit 202B of the data bit 202 is used to store the status data that is transmitted back to the computer system 102 from the sound effect system 10B. Similarly, the first sub-unit 204A is used to store the control code that is transmitted from the computer system 102 to the sound effect system 10B. The second sub-unit 204B of the control bit 204 is used to store the confirming code that is transmitted back to the computer system 102 from the sound effect system 10B. The confirming code is used to make sure that the computer system 102 and the sound effect system 10B are in the status of frame synchronization.

Figure 2C:
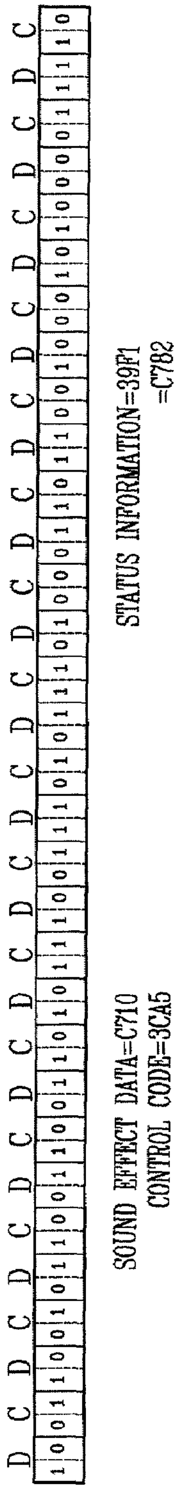

Further, in the FIG. 2A, the computer system 102 transmits the reset pattern of the control code "00A5" in the control bit 204 to the sound effect system 10B. Wherein the "00A5" is constructed by 16 bits and respectively locate in each first sub-unit 204A of the control bit 204, sequentially. The sound effect data and the frame synchronization confirming code are belong to the "Don't care term",which is indicated by "x" in FIG. 2A. The sound effect system 10B filters the reset pattern of the "00A5" from the transmitted frame, and further transmitting the synchronization confirming code "00FF" back to the computer system 102. The reset pattern is extreme important due to the method uses one pin 122A to transmit the digital control code. Thus, the computer system 102 must continually transmit the reset pattern so as for the sound effect system 10B may self-reset while recognize the reset pattern. The transmission of synchronization confirming code to the computer system 102 may make sure that the sound effect system is frame synchronization with the computer system 102. Thus, the computer system 102 and the sound effect system 10B may transmit data with each other, the transmitted data is shown in FIG. 2C as an example. As shown in FIG. 2C, the transmitted sound effect data includes "C71D",and the control code is "3C5A". Thus, after the sound effect system 10B receives the sound effect data "C71D" transmitted from the computer system 102, the control circuits 108B according to the control code "3C5A" controls the sound effect performed by the speaker when the speaker receiving the sound effect data "C71D".

It has to be noted, the computer system 102 may transmits the reset pattern to the sound effect system 10B, continuously, and it may set a predetermined threshold in order to wait for the sound effect system 10B transmits back the synchronization confirming code. When the transmission delaying time (or the number of transmission times) of the transmitted reset pattern is over the threshold, then the computer system 102 transmits the sound effect data by using the conventional method as shown in FIG. 1A. Further, the computer system 102 may add "A5" reset pattern in the latter portion of each digital control code to define that the transmitted data is completed. The division of the control code may be variation depending on the actual practice. For example, the control code may be divided into former portion with 10 bits and latter with 6 bits. The bit number of the control code can be increased to 64 bits or more. It is intended to cover various modifications and similar arrangements included within the spirit and scope of the appended claims.

The control code may be further divided. For example, the "3C" in the control code "3C5A" may be divided into "00111110", the former three bits "001" is used as the speaker code and others "11110" is used for the control code to control the vibration of the speaker. In an embodiment, the sub woofer speaker 118, FL-speaker 110, FR-speaker 112, RL-speaker 114, RR-speaker 116 and the voice speaker 106 may be coded as "000", "001", "010", "011", "100"and "101", respectively. The aforementioned control code "001" refers to the FL-speaker 110. The definition of the code maybe altered depending on the actual practice. For example, "11110" refers to changing the volume level to 30th level (total 32 volume levels). The above control code "3C" is referred to adjusting the volume level of the FL-speaker 110 to 30th level. Each individual speaker may be controlled by the computer system 102, the user may adjust the playing parameters of each speakers by means of computer system 102. Therefore, the user may change the effect performed by the speakers depending on the locations of each speaker. After the decoding of the control code, the sub woofer speaker 118, FL-speaker 110, FR-speaker 112, RL-speaker 114, RR-speaker 116, the voice speaker 106, volume level and the power are controlled via the transmission line 128, 130, 132, 134, 136 and 138. When the bit number of the reset pattern is reduced to 6 bits, the sound effect system 10B has more vacant bits for speaker playing parameter such as volume level, sound quality and power status.

Figures 4A, 4B, 4C, 4D, 4E, 4F, 4H:
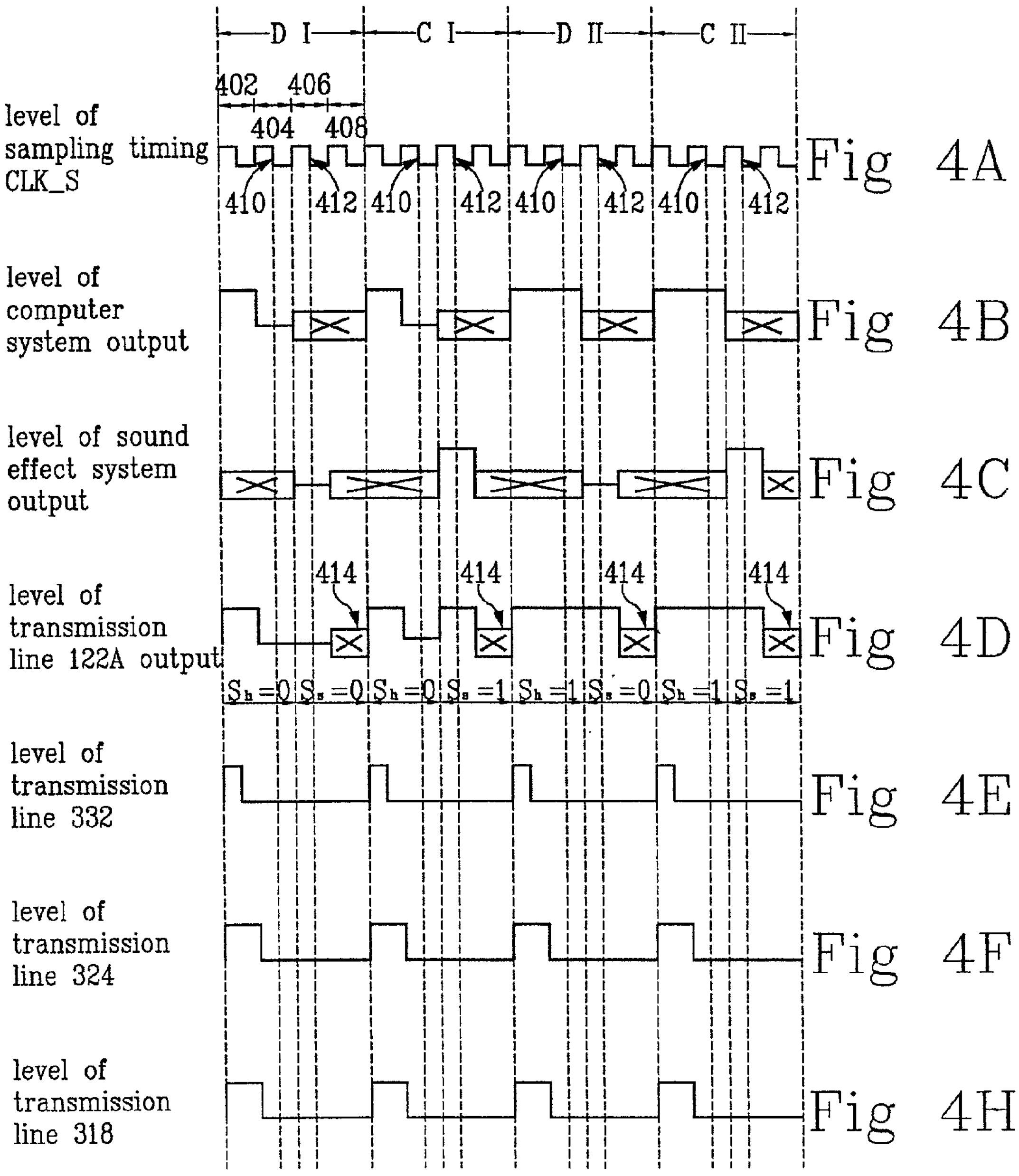

Next turning to FIG. 4A–4G, the drawings illustrates the voltage waveform while transmitting the data. FIG. 4A illustrates the sampling waveform CLK_S that is the synchronization timing of the computer system 102 and the sound effect system 10B. FIG. 4B is the output voltage level waveform of the computer system 122. FIG. 4C is the output voltage level waveform of the sound effect system 10B. FIG. 4D is the composition waveform of FIG. 4B and FIG. 4C. The present invention uses four-times bandwidth to transmit and receive data, as known in the art, other band width may be used such as eight-times band width.

The signal transmitted on the transmission line 122A is divided into four portions by four times sampling timing CLK_S shown in FIG. 4A. Wherein the second timing cycle 404 falling edge 410 of the sampling timing CLK_S is the sound effect data from the computer system 102 to sound effect system 10B. Similarly, the third timing cycle 406 falling edge 412 of the sampling timing CLK_S is the data from sound effect system 10B to the computer system 102. The sampling timing CLK_S's first timing cycle 402 is used as the recognition code to define the beginning of data string. Thus, during each sampling timing CLK_S's first timing cycle 402, the voltage level of transmission line 122A maintains at "logic 1". The signal carried by the transmission line 122A includes the data transmitted between the computer system 102 and the sound effect system 10B. The computer system 102 has to indicate the signal by "logic 1" or "logic 0" using the voltage level to transmit the data to sound effect system 10B during the sampling timing CLK_S's second timing cycle 404. During the third and fourth timing cycle 406, 408, the voltage levels are floating, thereby voltage output by the computer system 102 is slightly higher than the level of "logic 0". Further, the first timing cycle 402 is utilized to indicate the beginning of data string, thus each first timing cycle 402 maintains at high level and the waveform is shown in FIG. 4B.

On the another hand, during the first timing cycle 402 and the second timing cycle 404, the sound effect system 10B fetches the data from the transmission line 122A and the output is set at the status of floating. Besides, the third timing cycle 408 of the sound effect system 10B also floating and the waveform of the sound effect system 10B is shown in FIG. 4C. Apparently, the waveform of the transmission line 122A is the composition of the FIG. 4B and 4C and the result is illustrated in FIG. 4D. The fourth timing cycle 408 maintains floating indicated by 414. It is important for floating during the fourth timing cycle 408 due to each bit cell's first timing cycle 402 has to maintain at high voltage level to distinguish each cell.

FIG. 4A–4D illustrates the waveform of the two data bit cells DI and DII and the control bit cell CI and CII. The transmission line is sampling at the falling edges 410, 412 of the second and third timing cycle 404, 406 in each bit cell, $S_h$ and $S_s$ are respectively used to indicate the data that comes from the computer system 102 or sound effect system 10B. For example, When the sampling at the falling edge 410, 412 in the bit cell DI is taken, the level is "logic zero". It defines that the data of bit cell DI includes "$S_h$=$S_s$=0". Similarly, the data of bit cell DII includes "$S_h$=0, $S_s$=1". The data of control cell CI includes "$S_h$=0, $S_s$=1" and the data of control cell CII includes "$S_h$=1, $S_s$=1".

Figure 3:
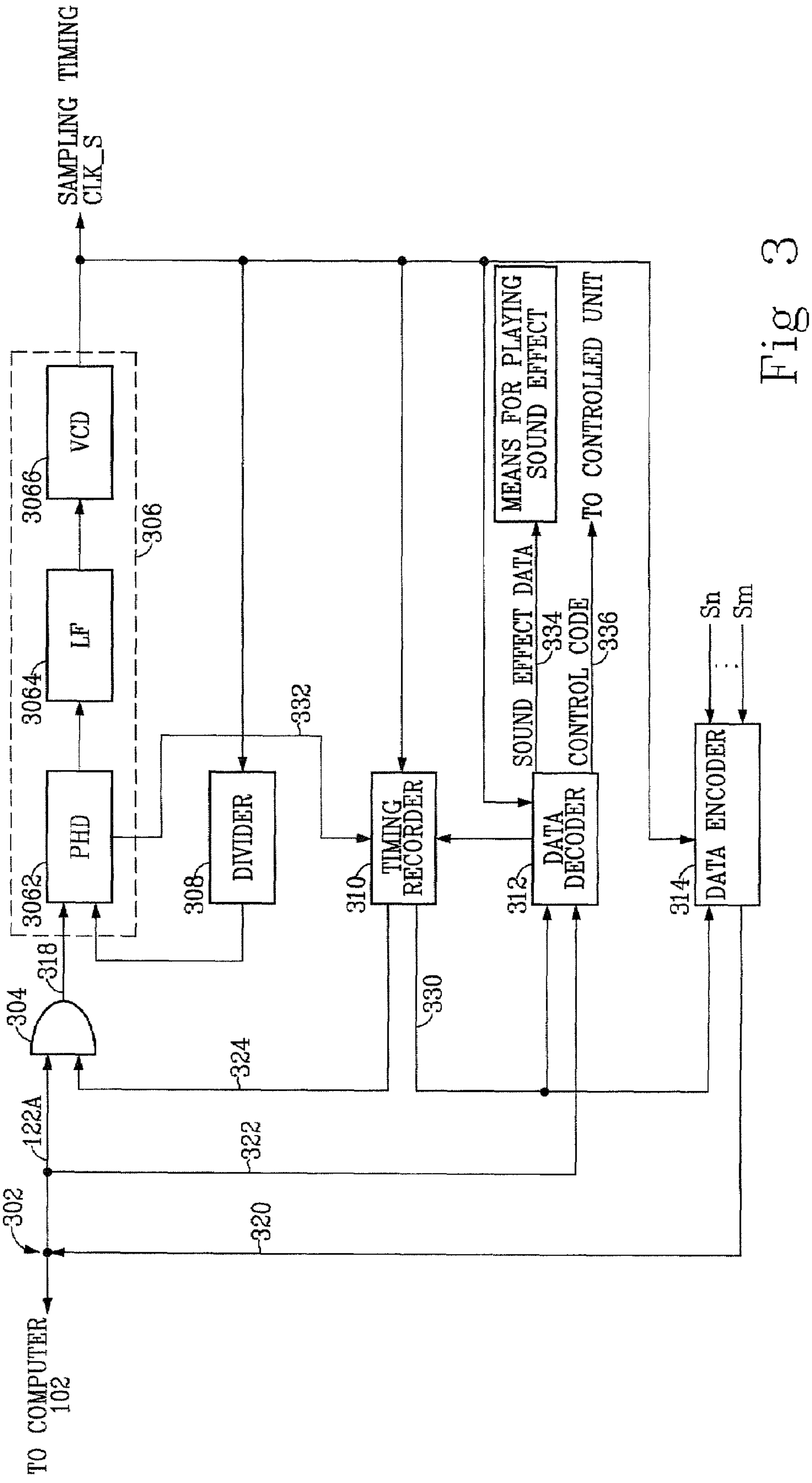
FIG. 3 is control circuits architecture of the present invention.

Next, please turn to FIG. 3, it illustrates the circuit architecture for control circuits 108B transmits and receives data by transmission lines 122A. The transmission between the computer system 102 and the sound effect system 10B only uses one-transmission line 122A. If the synchronization timing can not be transmitted, the control circuits 108B has to generate the same synchronization sampling timing CLK_S with the one of the computer system 102 in the sound effect system 10B via the voltage of the transmission line 122A. The internal oscillator can generate the sampling timing CLK_S of the computer system 102. The transmission line uses the node 302 of one or Wire-OR to compose the signal from the computer system 102 and the sound effect system 10B. After the Logic AND calculates the signal fed from the AND gate 304 and the transmission line 324. The result is output to PLL (phase lock loop) 306 by transmission line 318 to generate sampling timing CLK_S. Basically, the control circuits 108B uses PLL 306 and divider 308 to generate sampling timing CLK_S in the sound effect system 10B. The PLL 306 includes phase detector (PHD) 3062, loop filter (LF) 3064 and voltage controlled oscillator (VCO) 3066. As matter of fact, any type of PLL may be applied in the present invention. In the case of four-times sampling CLK_S, the divider 308 is a four-divider.

The control circuits 108B fetches the data transmitted by the transmission line 324 via the data decoder 312 and timing recorder 310. After the data of the data transmission frame is fetched, all of the data are composition to from sound effect data and control code, following transmitting by transmission lines 334, 336 to the means for playing the sound effect 316 and to the controlled unit defined by the control code. For example, the "A5" of the control code "3CA5" is used for resetting pattern and the "3C" is used to adjust the volume level of the FL speaker 110 to the 30th level. As aforementioned, the control circuits also includes data encoder 314 to transform the status information and synchronization confirming code of the sound effect system 10B into binary format. When at the falling edge 412 timing recorder 310 transmits the data by transmission line 320 and further transmission the data to computer system 102 via the transmission line 122A.

It has to be note, when the data encoder 314 outputs high level (logic one) during the third timing cycle 406 of the timing CLK_S, the high voltage level pushes the PLL 306 to the status of reset and resulting a calculation error is generated. In order to prevent the issue from being generated, the timing records 310 at the third timing cycle 406 of the timing CLK_S detected by the phase detector (PHD) 3062, a mask signal ("logic zero") is generated to input to AND GATE 304 via transmission line 324. This makes the voltages level of the transmission line 318 maintains at low level at the third timing cycle 406 of the timing CLK_S, thereby preventing the PLL 306 from being interrupted. FIG. 4E, 4F and 4G shows the voltage waveforms of the transmission lines 332, 324, 318. The means for playing sound effect 316 may play the fetched sound effect data, such as directly plays the signal through the DAC (digital-analog converter) or after oversampling. The data encoder 314 encodes the data in accordance with the $S_{ff}$–$S_{fn}$ signals, after transforms to binary format the signal is transmitted to the computer system 102 by transmission line 320, 122A. The $S_{ff}$–$S_{fn}$ represents the status of the sound effect system 10B such as the speaker is power on or not, the system is in green mode or not and so on. Logic gates may construct the timing recorder 310, data encoder 314 and the data decoder 312.

Figure 5A:
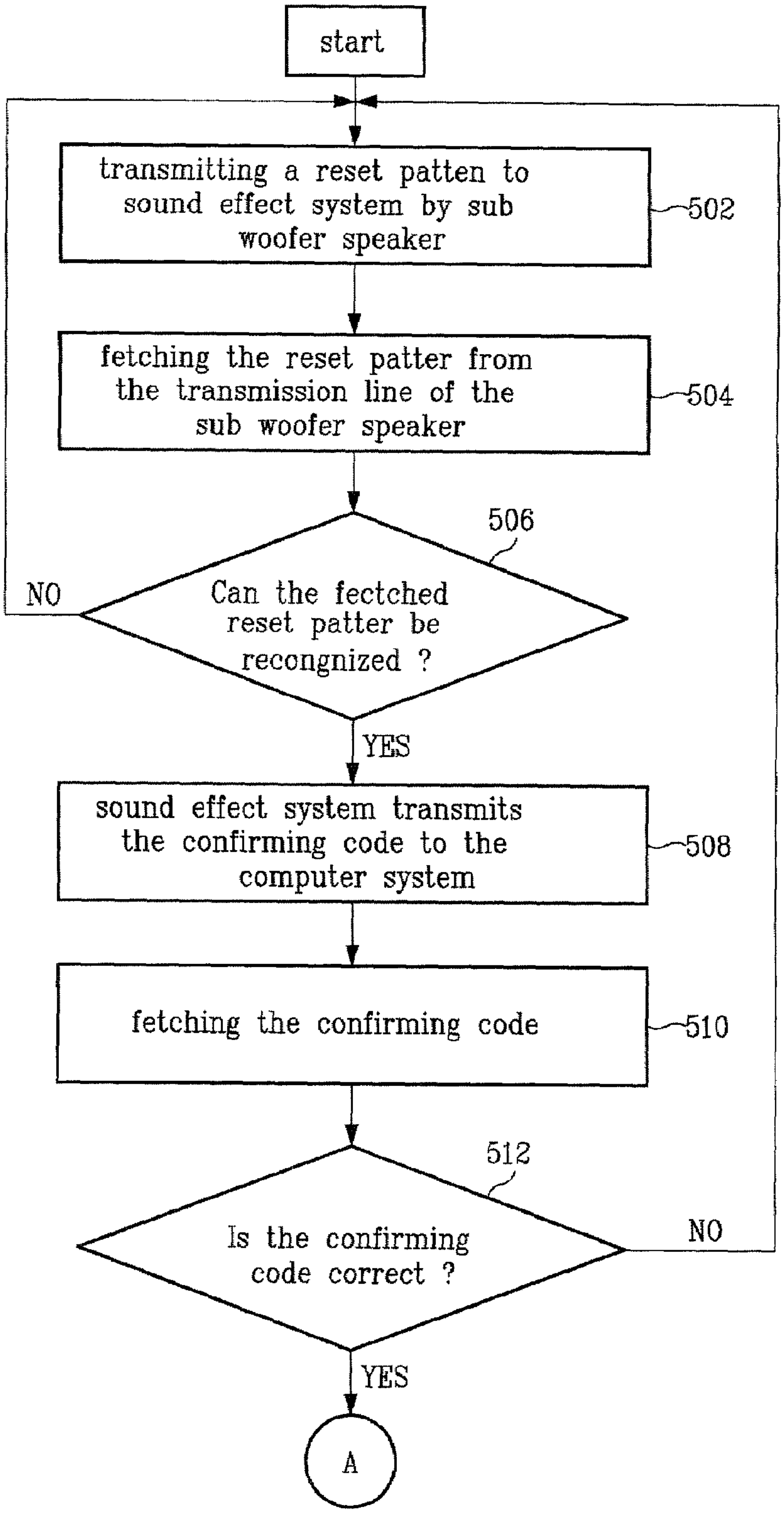
FIGS. 5A–5B are the process flow charters according to the present invention.
Figure 5B:
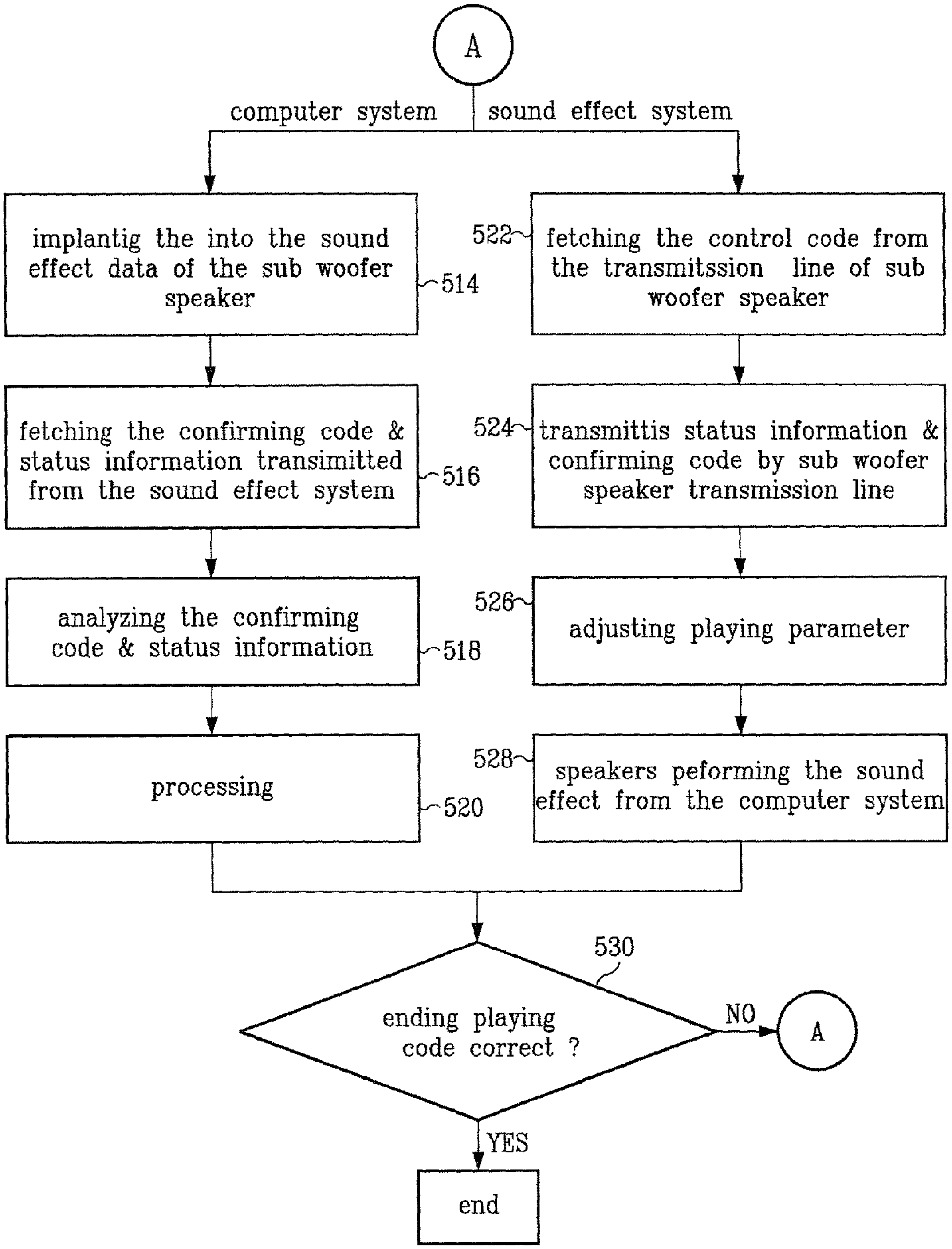

FIG. 5A illustrates the preferred embodiment of the present invention, it illustrates the flow chart to obtain the synchronization status for the computer system 102 and the sound effect system 10B. FIG. 5B illustrates the flow chart to transmit between the computer system 102 and the sound effect system 10B after synchronization status. It should be note that the transmission of the control code, the status information will be processed after synchronization. If the transmission of the reset patter over the threshold, the computer system 102 will transmit the information by conventional method.

Turning to FIG. 5A, in step 502, the computer system 102 transmits the reset pattern to the control circuit 108B of the sound effect system 10B via the transmission line 122A of the sub woofer speaker 118. Next, the sound effect system 10B fetches the reset pattern from the transmission line 122A in step 504. Then, the sound effect system 10B, in step 506, recognizes the fetched reset pattern. If the reset pattern is recognized, then the step 508 is processed to transmit the synchronization confirming code to the computer system 102. Otherwise, back to step 502, the computer system 102 transmits the reset pattern to the sound effect system 10B again. Subsequently, the computer system 102 in step 510 fetches the confirming code from the sound effect system 10B, followed by processing step 512 to recognize the confirming code. When the confirming code is incorrect, then backs to step 502 and processes the steps 502-510. On the contrary, if the confirming code is correct, then processing the next step shown in FIG. 5B via node A.

FIG. 5B illustrates the flow chart of operating the computer system 102 and sound effect system 10B, respectively. The computer system 102 and sound effect system 10B respectively fetches and transmits the data by means of sampling timing CLK_S, therefore, the two individual system will not interrupt with each other.

After the synchronization, in step 514, the computer system 102 locates the control code needed by the sound effect system 10B into the sound effect data of the sub woofer speaker 118, and the data is transmitted to the sound effect system 10B via the transmission line 122A. All of the signals are respectively transmitted to each speaker via corresponding transmission line. The computer system 102 in step 516 fetches the confirming code and status information transmitted from the sound effect system 10B. Next, the computer system 102 analyzes the confirming code and status information in step 518. Step 520 is to process the necessary function according to the analysis. Step 530 is to determine the playing process is end or not, if the determination is negative, then repeating the flow of steps 514–520.

In step 522, after the sound effect system 10B receives all of the signals for each speaker. The sound effect system 10B fetches the control code by the transmission line 122A of the sub woofer speaker. Then, the sound effect system 10B transmits the confirming code and status information to the computer system 102 via the transmission line 122A in step 526. Next, in step 526, the sound effect system 10B adjusts the status or playing parameter of the speakers, such as volume and the power status, by the instruction of the control code. The speakers perform the data send from the sound effect system 10B. Next step 530 is to determine the playing process is end or not, if the determination is negative, then repeating the flow of steps 514–520.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A control method for controlling the sound effect system, comprising:

implanting a control code into a sound effect data that is transmitted to a sub woofer speaker;

transmitting said sound effect data with said control code to said sound effect system;

transmitting a confirming code from said sound effect system to a computer system for synchronizing said sound effect system and said computer system; and controlling speakers of said sound effect system by means of said control code wherein a data transmission frame between said sound effect system and said computer system for controlling said sound effect system comprises a plurality of bit cells, wherein said data transmission frame includes:

a sound effect data transmitted by a data bit cell;

and a control code transmitted by a control bit cell; and wherein each said data bit cell and said control bit further divided by two sub-units comprises:

a first sub-unit of said data bit cell used to store a sound effect data transmitted from said computer system to said sound effect system;

a second sub-unit of said data bit cell used to store a status data transmitted back to said computer from said sound effect system;

a third sub-unit of said control bit cell used to store a control code transmitted from said computer system to said sound effect system, wherein said control code includes reset pattern; and a fourth sub-unit of said control bit cell used to store said confirming code.

2. The method of claim 1, wherein a sampling timing for said controlling method comprises:

a first timing cycle utilized to indicate the beginning of data string, each said first timing cycle maintaining at "logic one level";

a second timing cycle, said computer system indicating the signal by "logic 1" or "logic 0" using a voltage level to transmit data to said sound effect system during said second timing cycle; and a third timing cycle and a fourth timing cycle, during said third and said fourth timing cycle, wherein said voltage levels are floating, thus a voltage output by said computer system is slightly higher than the level of "logic 0".

3. The method of claim 2, wherein said sampling timing is generated by said phase lock loop (PLL).

4. The method of claim 3, wherein said third timing cycle is detected by a phase detector (PHD), a mask signal ("logic zero") is generated to input to an AND GATE via a transmission line, thereby maintaining the voltages level of said transmission line at low level during said third timing cycle to prevent said PLL from being interrupted.

5. The method of claim 4, wherein further including fetching said transmitted data by using a data decoder and a timing recorder; composing said fetched transmitted data from said sound effect data and said control code; and transmitting said sound effect data and said control code to means for playing said sound effect and to means defined by said control code.

6. The method of claim 1, comprising following steps to synchronize said computer system and said sound effect system:

transmitting said reset pattern from said computer system to said sound effect system by using a transmission line of said sub woofer speaker;

fetching said reset pattern from said transmission line by said sound effect system;

recognizing said fetched reset pattern by said sound effect system, if said reset pattern is recognized, then transmitting a synchronization confirming code to said computer system;

fetching said confirming code from said sound effect system by said computer system; and recognizing said confirming code, if said confirming code is correct, then transmitting said control code to said sound effect system.

7. The method of claim 6, further comprising a predetermined threshold in order to wait for said sound effect system to transmit back said synchronization confirming code, when transmission delaying time (or the number of transmission times) of said transmitted reset pattern is over said predetermined threshold, then said computer system transmits said sound effect data without said control code.

8. A control system for controlling a sound effect system by using a digital control signal, comprising:

a computer system for generating a control code and a sound effect data to control said sound effect system; and a control circuits implanted in said sound effect system to control a playing parameter of said sound effect system according to said control code and said sound effect data, wherein said control circuits generates a sampling timing in accordance with said control code, thereby creating frame synchronization between said computer system and said sound effect system, wherein said control code is implanted into said sound effect data that is transmitted to a sub woofer speaker and a confirming code is transmitted from said sound effect system to said computer system for synchronizing said computer system and said sound effect system wherein a data transmission frame between said sound effect system and said computer system for controlling said sound effect system comprises:

a data bit cell and a control bit cell; and each said data bit cell and said control bit cell further divided by two sub-units comprises:

a first sub-unit of said data bit cell used to store said sound effect data transmitted from said computer system to said sound effect system;

a second sub-unit of said data bit cell used to store a status data transmitted back to said computer from said sound effect system;

a third sub-unit of said control bit cell used to store a control code transmitted from said computer system to said sound effect system, wherein said control code includes reset pattern; and a fourth sub-unit of said control bit cell used to store said confirming code.

9. The control system of claim 8, wherein said computer system includes sound effect control unit, said sound effect control unit comprising:

a PLL (phase lock loop) including a phase detector (PHD) used to generate said sampling timing;

a timing recorder responsive to said phase detector (PHD) to generate a timing signal;

a data encoder responsive to said timing signal to encode a status information of said sound effect system in order to transmit to said computer system via said sub woofer speaker; and a data decoder responsive to said timing signal to decode said control code transmitted via said sub woofer speaker.

10. The control system of claim 9, wherein a sampling timing is generated by said phase lock loop for controlling, wherein said sampling timing comprises:

a first timing cycle utilized to indicate the beginning of data string, each said first timing cycle maintaining at "logic one level";

a second timing cycle, said computer system indicating the signal by "logic 1" or "logic 0" using a voltage level to transmit data to said sound effect system during said second timing cycle; and a third timing cycle and a fourth timing cycle, during said third and said fourth timing cycle, wherein said voltage levels are floating, thus a voltage output by said computer system is slightly higher than the level of "logic 0".

11. The control system of claim 10, wherein said third timing cycle is detected by said phase detector (PHD), a mask signal ("logic zero") is generated to input to an AND GATE via a transmission line, thereby maintaining the voltages level of a transmission line at low level during said third timing cycle to prevent said PLL from being interrupted.

12. The control system of claim 9, wherein said control system includes following steps to control said sound effect system:

fetching said transmitted data by using a data decoder and said timing recorder;

composing said fetched transmitted data from said sound effect data and said control code; and transmitting said sound effect data and said control code to means for playing said sound effect and to means defined by said control code.

13. The control system of claim 8, wherein said control system includes following steps to obtain said synchronization frame between said computer system and said sound effect system:

transmitting a reset pattern from said computer system to said sound effect system by using a transmission line of said sub woofer speaker;

fetching said reset pattern from said transmission line of a sub woofer speaker by said sound effect system;

recognizing said fetched reset pattern by said sound effect system, if said reset pattern is recognized, then transmitting a synchronization confirming code to said computer system;

fetching said confirming code from said sound effect system by said computer system; and recognizing said confirming code, if said confirming code is correct, then transmitting control code to said sound effect system.

14. The control system of claim 13, wherein said control system further comprises a predetermined threshold in order to waiting for said sound effect system to transmit back a synchronization confirming code, when transmission delaying time (or the number of transmission times) of said transmitted reset pattern is over said predetermined threshold, then said computer system transmits said sound effect data without said control code.

* * * * *

UNITED STATES PATENT AND TRADEMARK OFFICE

CERTIFICATE OF CORRECTION

PATENT NO. : 6,990,382 B2
DATED : January 24, 2006
INVENTOR(S) : Eric Cheng

It is certified that error appears in the above-identified patent and that said Letters Patent is hereby corrected as shown below:

<u>Column 1,</u>
Line 52, delete "144".

Signed and Sealed this

Twenty-first Day of March, 2006

JON W. DUDAS
*Director of the United States Patent and Trademark Office*